US007864621B2

(12) United States Patent
Ashizawa

(10) Patent No.: US 7,864,621 B2
(45) Date of Patent: Jan. 4, 2011

(54) COMPILED MEMORY, ASIC CHIP, AND LAYOUT METHOD FOR COMPILED MEMORY

(75) Inventor: Tetsuo Ashizawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 15 days.

(21) Appl. No.: 12/482,656

(22) Filed: Jun. 11, 2009

(65) Prior Publication Data
US 2009/0244988 A1 Oct. 1, 2009

Related U.S. Application Data

(63) Continuation of application No. PCT/JP2006/325093, filed on Dec. 15, 2006.

(51) Int. Cl.
*G11C 8/00* (2006.01)
(52) U.S. Cl. .................. 365/230.06; 365/185.11; 365/230.03
(58) Field of Classification Search ............ 365/230.06, 365/185.11, 230.03
See application file for complete search history.

(56) References Cited

U.S. PATENT DOCUMENTS 5,210,717 A 5/1993 Tamaki 7,259,977 B2 8/2007 Takeyama et al.
2002/0154042 A1* 10/2002 Igarashi et al. ............. 341/67
2004/0042275 A1 3/2004 Yoshizawa et al.

FOREIGN PATENT DOCUMENTS

| JP | 04-209392 A | 7/1992 |
| JP | 08-87885 A | 4/1996 |
| JP | 2000-156081 A | 6/2000 |
| JP | 2002-230060 A | 8/2002 |
| JP | 2004-95058 A | 3/2004 |
| JP | 2006-32577 A | 2/2006 |

* cited by examiner

*Primary Examiner*—Huan Hoang
*Assistant Examiner*—Jason Lappas
(74) *Attorney, Agent, or Firm*—Arent Fox LLP

(57) ABSTRACT

Each of memory blocks includes word line groups each having at least one of word lines, memory cells and bit lines. A decoder unit selects couple control units corresponding to the memory blocks to be accessed, and decodes an address signal to select any of the word line groups. A logic of the decoder unit is formed by assigning a bit of the address signal to identify the memory blocks and the couple control units lower than a bit of the address signal to identify the word line groups. Accordingly, the numbers of word lines disposed at the memory blocks can be equalized with each other, and lengths of the bit lines can be shortened. As a result, a wiring delay of each of the bit lines can be minimized, and an access time of a compiled memory can be shortened.

15 Claims, 16 Drawing Sheets

| ADR4 | ADR3 | ADR2 | ADR1 | ADR0 | WL | WLG | MBLK |
|---|---|---|---|---|---|---|---|
| L | L | L | L | L | WL0 | WLG0 | MBLK0 |
| L | L | L | L | H | WL1 | WLG0 | MBLK0 |
| L | L | L | H | L | WL2 | WLG0 | MBLK0 |
| L | L | L | H | H | WL3 | WLG0 | MBLK0 |
| L | L | H | L | L | WL4 | WLG1 | MBLK1 |
| L | L | H | L | H | WL5 | WLG1 | MBLK1 |
| L | L | H | H | L | WL6 | WLG1 | MBLK1 |
| L | L | H | H | H | WL7 | WLG1 | MBLK1 |
| L | H | L | L | L | WL8 | WLG2 | MBLK0 |
| L | H | L | L | H | WL9 | WLG2 | MBLK0 |
| L | H | L | H | L | WL10 | WLG2 | MBLK0 |
| L | H | L | H | H | WL11 | WLG2 | MBLK0 |
| L | H | H | L | L | WL12 | WLG3 | MBLK1 |
| L | H | H | L | H | WL13 | WLG3 | MBLK1 |
| L | H | H | H | L | WL14 | WLG3 | MBLK1 |
| L | H | H | H | H | WL15 | WLG3 | MBLK1 |
| H | L | L | L | L | WL16 | WLG4 | MBLK0 |
| H | L | L | L | H | WL17 | WLG4 | MBLK0 |
| H | L | L | H | L | WL18 | WLG4 | MBLK0 |
| H | L | L | H | H | WL19 | WLG4 | MBLK0 |
| H | L | H | L | L | WL20 | WLG5 | MBLK1 |
| H | L | H | L | H | WL21 | WLG5 | MBLK1 |
| H | L | H | H | L | WL22 | WLG5 | MBLK1 |
| H | L | H | H | H | WL23 | WLG5 | MBLK1 |

FIG. 11

| ADR3 | ADR2 | ADR1 | ADR0 | WL | MU | MBLK |
|------|------|------|------|------|-----|-------|
| L | L | L | L | WL0 | MU0 | MBLK0 |
| L | L | L | H | WL1 | MU0 | MBLK1 |
| L | L | H | L | WL2 | MU0 | MBLK2 |
| L | L | H | H | WL3 | MU0 | MBLK3 |
| L | H | L | L | WL4 | MU1 | MBLK0 |
| L | H | L | H | WL5 | MU1 | MBLK1 |
| L | H | H | L | WL6 | MU1 | MBLK2 |
| L | H | H | H | WL7 | MU1 | MBLK3 |
| H | L | L | L | WL8 | MU0 | MBLK0 |
| H | L | L | H | WL9 | MU0 | MBLK1 |
| H | L | H | L | WL10 | MU1 | MBLK2 |
| H | L | H | H | WL11 | MU1 | MBLK3 |

FIG. 14

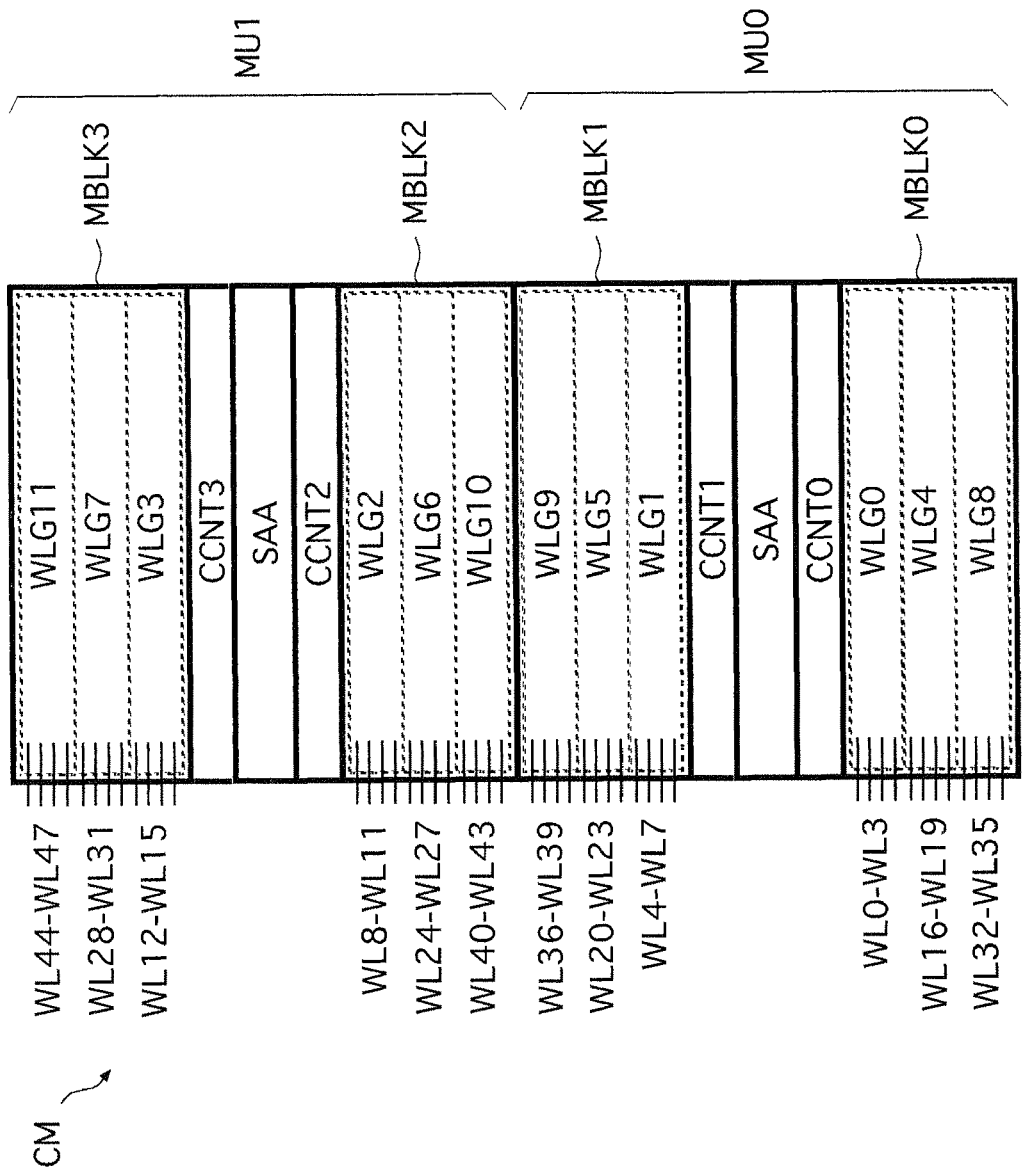

FIG. 16

| | WLG | | MBLK | | WL | | WL | WLG | MBLK |
|---|---|---|---|---|---|---|---|---|---|
| ADR5 | ADR4 | ADR3 | ADR2 | ADR1 | ADR0 | | | | |
| L | L | L | L | L | L | WL0 | WLG0 | MBLK0 |
| L | L | L | L | L | H | WL1 | WLG0 | MBLK0 |
| L | L | L | L | H | L | WL2 | WLG0 | MBLK0 |
| L | L | L | L | H | H | WL3 | WLG0 | MBLK0 |
| L | L | L | H | L | L | WL4 | WLG1 | MBLK1 |
| L | L | L | H | L | H | WL5 | WLG1 | MBLK1 |
| L | L | L | H | H | L | WL6 | WLG1 | MBLK1 |
| L | L | L | H | H | H | WL7 | WLG1 | MBLK1 |
| L | L | H | L | L | L | WL8 | WLG2 | MBLK2 |
| L | L | H | L | L | H | WL9 | WLG2 | MBLK2 |
| L | L | H | L | H | L | WL10 | WLG2 | MBLK2 |
| L | L | H | L | H | H | WL11 | WLG2 | MBLK2 |
| L | L | H | H | L | L | WL12 | WLG3 | MBLK3 |
| L | L | H | H | L | H | WL13 | WLG3 | MBLK3 |
| L | L | H | H | H | L | WL14 | WLG3 | MBLK3 |
| L | L | H | H | H | H | WL15 | WLG3 | MBLK3 |
| L | H | L | L | L | L | WL16 | WLG4 | MBLK0 |
| L | H | L | L | L | H | WL17 | WLG4 | MBLK0 |
| L | H | L | L | H | L | WL18 | WLG4 | MBLK0 |
| L | H | L | L | H | H | WL19 | WLG4 | MBLK0 |
| L | H | L | H | L | L | WL20 | WLG5 | MBLK1 |
| L | H | L | H | L | H | WL21 | WLG5 | MBLK1 |
| L | H | L | H | H | L | WL22 | WLG5 | MBLK1 |
| L | H | L | H | H | H | WL23 | WLG5 | MBLK1 |
| L | H | H | L | L | L | WL24 | WLG6 | MBLK2 |
| L | H | H | L | L | H | WL25 | WLG6 | MBLK2 |
| L | H | H | L | H | L | WL26 | WLG6 | MBLK2 |
| L | H | H | L | H | H | WL27 | WLG6 | MBLK2 |
| L | H | H | H | L | L | WL28 | WLG7 | MBLK3 |
| L | H | H | H | L | H | WL29 | WLG7 | MBLK3 |
| L | H | H | H | H | L | WL30 | WLG7 | MBLK3 |
| L | H | H | H | H | H | WL31 | WLG7 | MBLK3 |
| H | L | H | H | H | H | WL47 | WLG11 | MBLK3 |

US 7,864,621 B2

COMPILED MEMORY, ASIC CHIP, AND LAYOUT METHOD FOR COMPILED MEMORY

CROSS-REFERENCE TO RELATED APPLICATIONS

This application is based upon and claims the benefit of priority of the prior International Patent Application No. PCT/JP2006/325093, filed on Dec. 15, 2006, the entire contents of which are incorporated herein by reference.

FIELD

The present embodiments relate to a compiled memory formed on a chip such as an ASIC and a layout method for the compiled memory.

BACKGROUND

In an LSI such as an ASIC (Application Specific IC), there is a case when a memory such as an SRAM accessed by a functional block on the ASIC chip is implemented. It is often the case that a memory capacity can be made variable according to a system specification of a user in this kind of memory. A layout data of a memory having an arbitrary memory capacity specified by the user is generated by using a layout design tool such as a compiler. The memory (microcell) is automatically generated by inputting the arbitrary number of bits and the number of words into the compiler. The memory automatically generated by the compiler is called as a compiled memory or a compiled.

In general, in the memory such as the SRAM, as the number of memory cells coupled to bit lines transmitting data signals is large, load capacitance and wiring delay of the bit lines increase, and an access time becomes long. Japanese laid-open Patent Publication No. 2006-32577 describes a method in which the bit line includes a local bit line and a global bit line (hierarchical bit line structure) is proposed so as to decrease the number of the memory cells coupled to the bit line and to shorten the access time. In this case, the local bit line is wired in a memory cell array and to be directly coupled to the memory cells. The global bit line is coupled to the local bit line on the memory cell array, and coupled to a data input/output circuit.

SUMMARY

According to an aspect of the embodiment, a compiled memory formed on a chip with a functional block and accessed by the functional block includes: a pair of memory blocks each including word groups each having at least one of word lines, memory cells coupled to the word lines, and bit lines coupled to each of the memory cells; a data control unit inputting/outputting a data signal to/from the memory cells via the bit lines; couple control units each provided with correspond to the memory blocks to selectively couple the bit lines of each of the memory blocks to the data control unit; and a decoder unit selecting one of the couple control units corresponding to one of the memory blocks to be accessed, and decoding an address signal to select any of the word groups, wherein a logic of the decoder unit is formed by assigning a bit of the address signal to identify one of the memory blocks and one of the couple control units lower than a bit of the address signal to identify one of the word groups.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is an explanatory view illustrating a logic of a main decoder in the fourth embodiment;

FIG. 14 is an explanatory view illustrating a logic of a main decoder in the fifth embodiment;

FIG. 15 is a circuit diagram illustrating a compiled memory in a sixth embodiment of the present invention; and FIG. 16 is an explanatory view illustrating a logic of a main decoder in the sixth embodiment.

DESCRIPTION OF EMBODIMENTS

Figure 1:
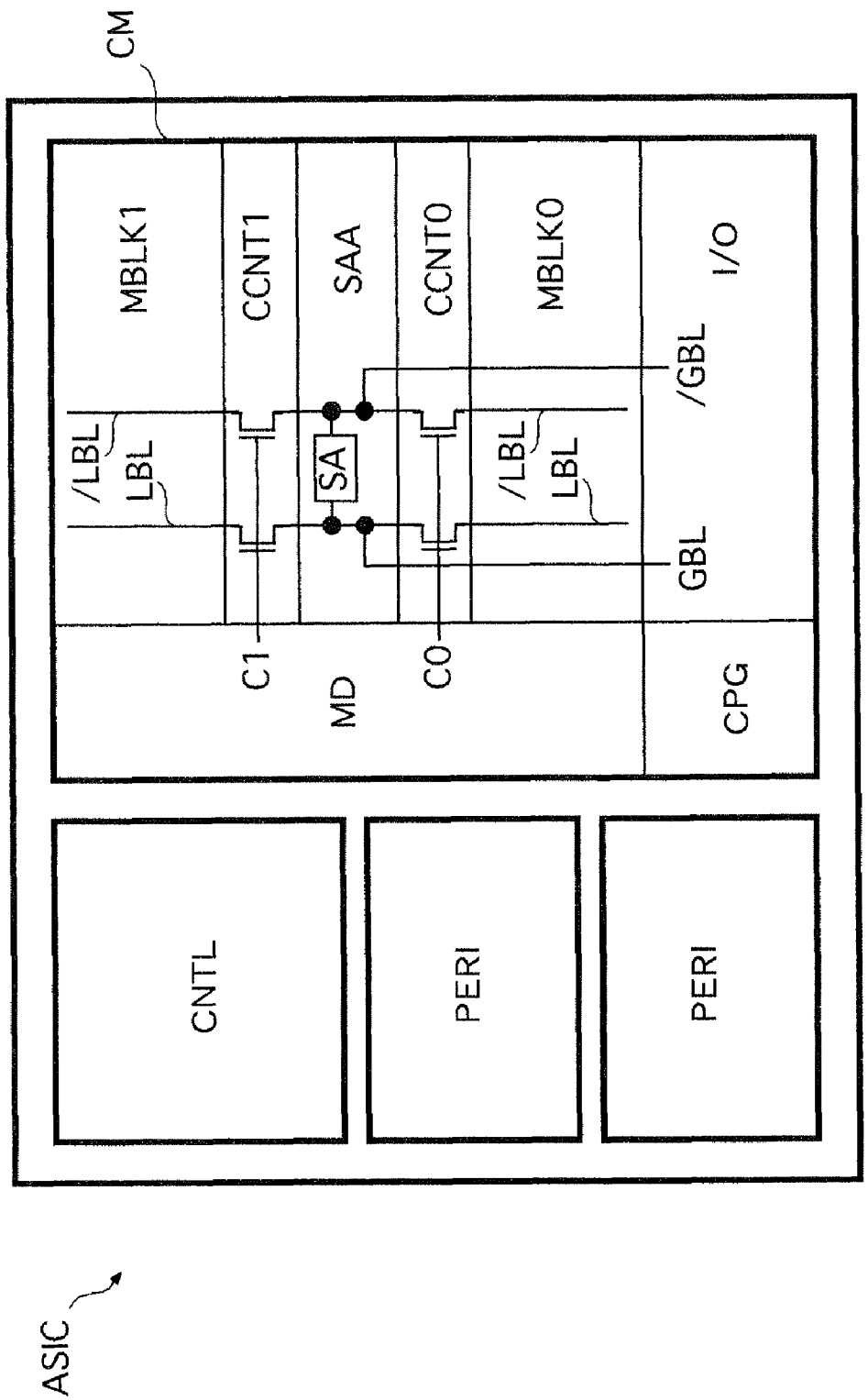
FIG. 1 is a block diagram illustrating a first embodiment of the present invention.

Hereinafter, embodiments are described with reference to the drawings. In the drawings, the same code as a signal name is used for a signal line where a signal is transmitted.

FIG. 1 illustrates a first embodiment of the present invention. A compiled memory CM is, for example, an SRAM core, and formed on an ASIC chip with functional blocks such as a controller CNTL and peripheral circuits PERI, to hold data and so on used by the controller CNTL. The compiled memory CM is accessed by the controller CNTL such as a CPU. In the drawing, the compiled memory is drawn largely for easy to understand. In an actual ASIC chip, many functional blocks other than the illustrated ones are implemented on the chip. A system is formed as the ASIC chip independently, or the system is formed as the ASIC chip and the other semiconductor chips.

The compiled memory CM includes a pair of memory blocks MBLK0-1, couple control units CCNT0-1 respectively corresponding to the memory blocks MBLK0-1, a sense amplifier area SAA including a sense amplifier SA commonly used by the memory blocks MBLK0-1, a main decoder MD, a data input/output unit I/O and a timing control unit CPG.

A pair of local bit lines LBL, /LBL of each of the memory blocks MBLK0-1 is coupled to the sense amplifier SA and a pair of global bit lines GBL, /GBL via column switches (transistors) formed at the couple control units CCNT0-1. The pair of global bit lines GBL, /GBL is coupled to the data input/output unit I/O. It is possible to shorten the local bit lines LBL, /LBL and to shorten an access time by forming bit lines by using the local bit lines LBL, /LBL and the global bit lines GBL, /GBL (hierarchical structure).

The main decoder MD decodes an address signal ADR (FIG. 2) output from the controller CNTL, outputs column selection signals C0, C1 to turn on the column switches according to a decoded result, and selects one of word lines WL (FIG. 2) wired in the memory blocks MBLK0-1.

The data input/output unit I/O outputs a read data on the pair of global bit lines GBL, /GBL to the controller CNTL via a data bus of the ASIC chip, and outputs a write data transmitted from the controller CNTL via the data bus of the ASIC chip to the pair of bit lines GBL, /GBL via a data bus of the ASIC chip. The sense amplifier SA and the data input/output unit I/O operate as a data control unit transmitting data signals to the memory cells MC (FIG. 3) of the memory blocks MBLK0-1 via the bit lines LBL, /LBL, GBL, /GBL. The timing control unit CPG generates control signals (timing signals) controlling operations of the main decoder MD, the data input/output unit I/O, the sense amplifier SA, and so on according to access command output from the controller CNTL to access the compiled memory CM.

Memory capacity of the compiled memory CM is designed to fit to a data size used by the controller CNTL. Namely, the memory capacity of the compiled memory CM (sizes of the MBLK0-1) is determined in accordance with a user specification of the ASIC chip. As it is described later, a layout design of the main decoder MD is performed so that the sizes of the memory blocks MBLK0-1 are to be equal with each other in the present embodiments. Accordingly, it is possible to constantly minimize lengths of the local bit lines LBL, /LBL independent from the memory capacity (user specification) of the compiled memory CM. As a result, the minimum access time can be realized.

Figure 2:
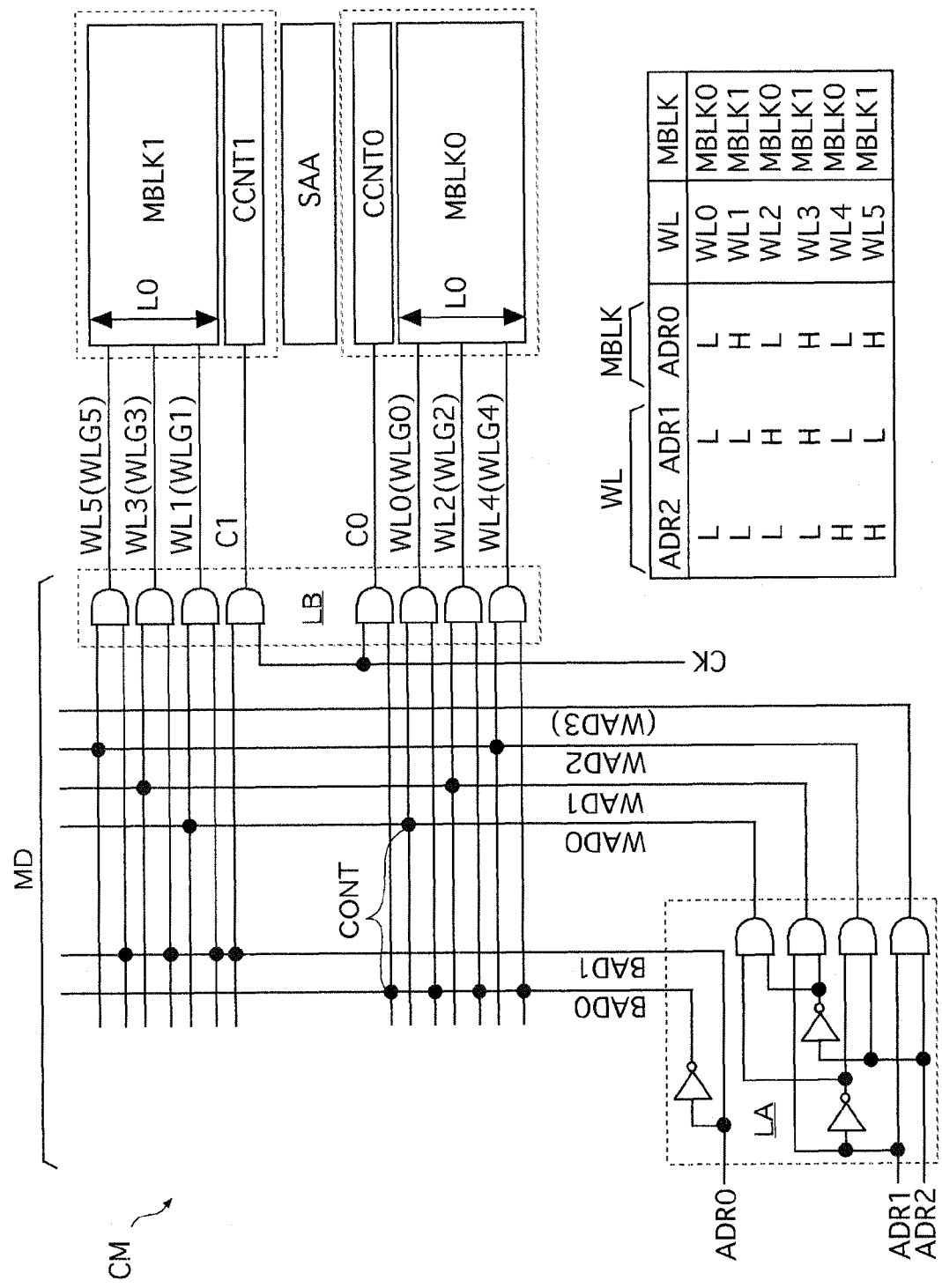
FIG. 2 is a circuit diagram illustrating a detail of a main decoder of a compiled memory illustrated in FIG. 1.
Figure 7:
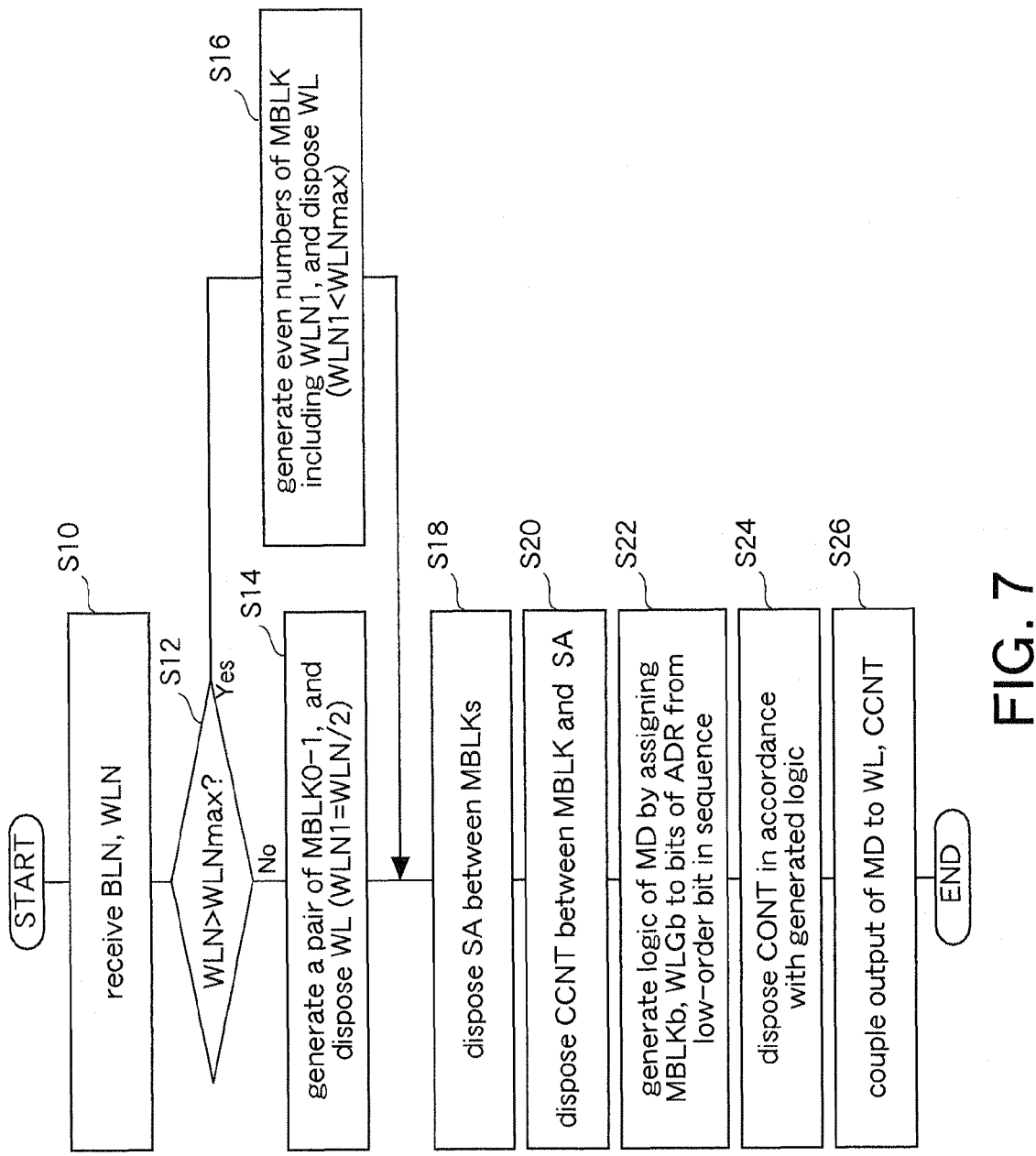
FIG. 7 is a flowchart illustrating a layout method for the compiled memory in the first embodiment.

FIG. 2 illustrates a detail of the main decoder MD illustrated in FIG. 1. The main decoder MD includes logic circuits LA, LB, wirings in a mesh state coupling between the logic circuits LA, LB and contact units CONT disposed at intersection parts of the wirings. Positions of the contact units CONT are determined by a later-described layout method (FIG. 7).

The logic circuit LA decodes the address signal ADR (ADR0-2), and generates block decoded signals BAD0-1 and word decoded signals WAD0-2. The logic circuit LB outputs word line signal WL (WL0-5) according to decoded signal lines BAD0-3, WAD0-2. In the logic circuit LB, the column selection signals C0-1 are output in synchronization with a clock CK output from the timing control unit CPG responding to an access command.

The memory blocks MBLK0-1 are laid out while using a word group WLG (word step) including at least one word line WL as a unit. In this embodiment, the word group WLG is formed by one word line WL. Accordingly, the numbers of the respective word groups WLG0-5 are the same as the numbers of the word lines WL0-5.

In this embodiment, the memory blocks MBLK0-1 and the couple control units CCNT0-1 are identified by the lowest-order bit ADR0 of the address signal ADR. The word lines WL (word groups WLG) in each of the memory blocks MBLK0-1 are identified by high-order bits ADR1-2 of the address signal ADR. Namely, the logic of the main decoder MD is formed by assigning the bit of the address signal ADR to identify the memory blocks MBLK0-1 and the couple control units CCNT0-1 lower than the bits of the address signal ADR to identify the word groups WLG.

For example, when the logic of the address signal ADR0-2 is "LLL", the word line WL0 of the memory block MBLK0 is selected. In the next address signal ADR0-2 (HLL), the word line WL1 of the memory block MBLK1 is selected. As stated above, the memory blocks MBLK0-1 are selected alternately to be accessed as the address signal ADR0-2 advance sequentially. The example is described in which the number of word lines WL (the word number) is set to be "6" by a user specification for easy to understand of the description, in this example. The main decoder MD is designed to decode the address signal ADR0-2 in three bits.

In an actual compiled memory CM, the word number is set within a range of, for example, from "4" to "1024". For example, when the maximum word number which can be disposed at the memory block MBLK is "512" and the word number is set at "600", the word numbers of the memory blocks MBLK0-1 are each set at "300". The memory blocks MBLK0-1 are identified by the address signal ADR0 (the lowest-order bit). The word lines WL in each of the memory blocks MBLK0-1 are identified by the address signals ADR1-9. On the other hand, when the maximum word number is "256", and the word number is set at "600", four memory blocks MBLK0-3 are laid out as illustrated in later-described FIG. 13 and FIG. 15. In this case, the word numbers of each of the memory blocks MBLK0-3 are each set at "150". As stated above, the compiled memory CM is laid out such that the numbers of words of each of the memory blocks MBLK become minimum, and thereby, the lengths of the local bit lines LBL, /LBL orthogonal to the word lines WL can be minimized. In the example illustrated in FIG. 2, the lengths of the pair of local bit lines LBL, /LBL are L0 at both of the memory blocks MBLK0-1. As a result, the parasitic capacitance and the wiring resistance of each of the local bit lines LBL, /LBL can be made small, and the access time can be shortened.

Figure 3:
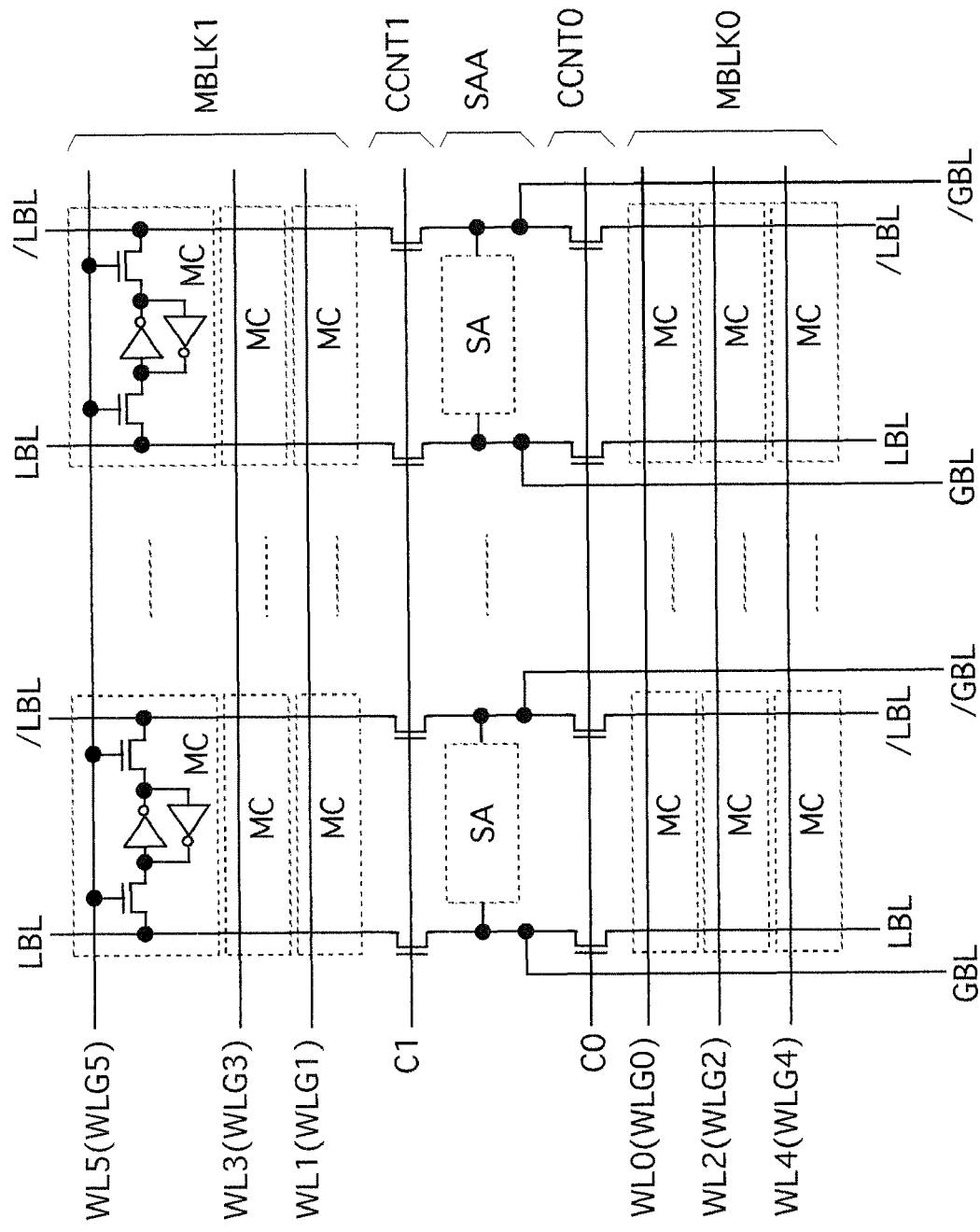
FIG. 3 is a circuit diagram illustrating a detail of a memory block illustrated in FIG. 1.

FIG. 3 illustrates a detail of the memory blocks MBLK0-1 illustrated in FIG. 1. Each of the memory blocks MBLK0-1 includes plural static memory cells MC disposed in a matrix state and coupled to the complementary local bit lines LBL, /LBL and the word lines WL. Each of the memory cells MC includes a latch having a pair of inverters and holding data, and a pair of transfer transistors (nMOS transistors) of which one ends are each coupled to complementary storage nodes of the latch (output nodes of respective inverters). The other end of the transfer transistor is coupled to either of the local bit lines LBL, /LBL. A gate of the transfer transistor is coupled to the word line WL.

The column switch formed at each of the couple control units CCNT0-1 includes the nMOS transistor, and it is turned on when the corresponding column selection signal C0 or C1 is at a high logic level. The pair of local bit lines LBL, /LBL is coupled to the sense amplifier SA and the pair of global bit lines GBL, /GBL by the turning on of the column switch. Incidentally, the sense amplifier area SAA includes a not-illustrated precharge circuit to precharge the pair of local bit lines LBL, /LBL into a predetermined voltage during a non-access period of the memory blocks MBLK0-1. A circuit controlling an input of a write data signal may be formed at the sense amplifier area SAA.

The sense amplifier SA is commonly used by the memory blocks MBLK0-1. The sense amplifier SA amplifies a signal amount of the data signal read from the memory cell MC to the pair of local bit lines LBL, /LBL, and transmits the amplified data signal to the pair of global bit lines GBL, /GBL during a read access operation. Incidentally, in a write access operation, a write data signal supplied from external of the compiled memory CM via the pair of global bit lines GBL, /GBL is transmitted to the pair of local bit lines LBL, /LBL coupled to the column switch which is turned on, and it is written to the memory cell MC coupled to the selected word line WL. At this time, the sense amplifier SA also operates.

Figure 4:
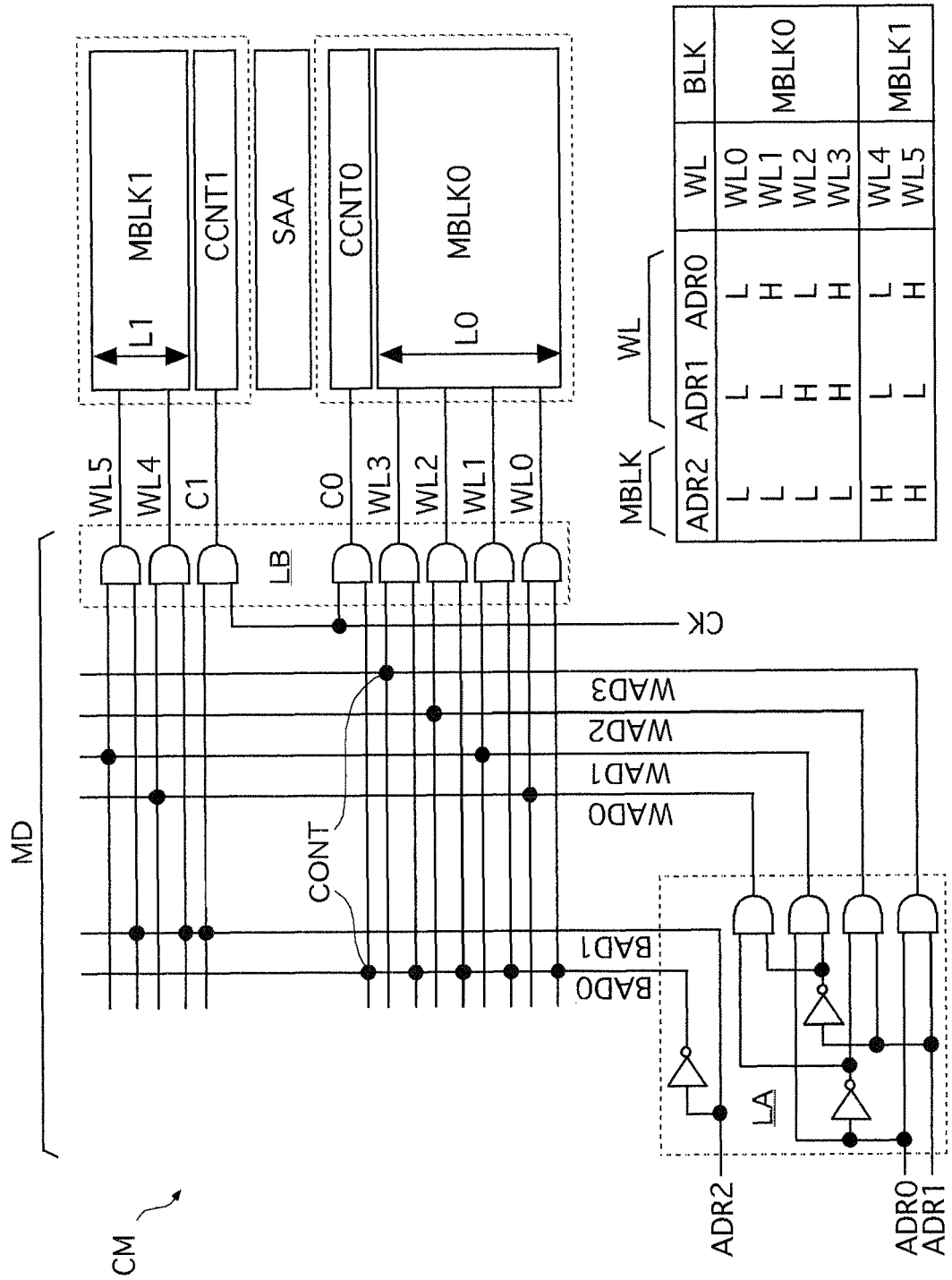
FIG. 4 is a circuit diagram illustrating a substantial part of another compiled memory.

FIG. 4 illustrates a substantial part of another compiled memory CM. In this example, it is described that the maximum word number which can be disposed at each of the memory blocks MBLK ((MBLK0-1) is "4". The compiled memory CM in FIG. 4 is laid out by sequentially disposing the word lines WL from a lower side of the drawing.

When the word number specified by a user is "6", at first, all of the word lines WL0-3 which can be disposed at the memory block MBLK0 are laid out. Next, the remaining word lines WL4-5 are laid out at the memory block MBLK1. As stated above, the maximum number of word lines WL is laid out at one memory block MBLK, and thereafter, the word lines WL are laid out at the next memory block MBLK. The maximum number of word lines WL (n-th power of two; in this example, n="2") is laid out at the memory block MBLK0, and therefore, the memory blocks MBLK are identified by the high-order bit ADR2 of the address signal ADR. The word lines WL are identified by the low-order bits ADR0-1 of the address signal ADR.

However, in the layout method illustrated in FIG. 4, a size of the memory block MBLK0 becomes always the maximum, and therefore, lengths L0 of the local bit lines LBL, /LBL (not illustrated) of the memory block MBLK0 become always maximum. On the other hand, lengths L1 of the local bit lines LBL, /LBL (not illustrated) of the memory block MBLK1 are shorter than the lengths L0. The access time (timing specification) of the compiled memory CM is determined based on a worst operation time. Accordingly, the access time is determined in accordance with the case when the lengths of the local bit lines LBL, /LBL are the maximum (L0). In other words, the access time of the compiled memory CM having the plural memory blocks MBLK is set in accordance with the case when the lengths of the local bit lines LBL, /LBL are the maximum regardless of the word number.

Incidentally, in general, the access time is a time from the read access command and the address signal are supplied to the compiled memory CM to a read data is output from the compiled memory CM. Otherwise, the access time is a time from the write access command, the write address signal, and the write data are supplied to the compiled memory CM to the write data is written to the memory cell.

Figure 5:
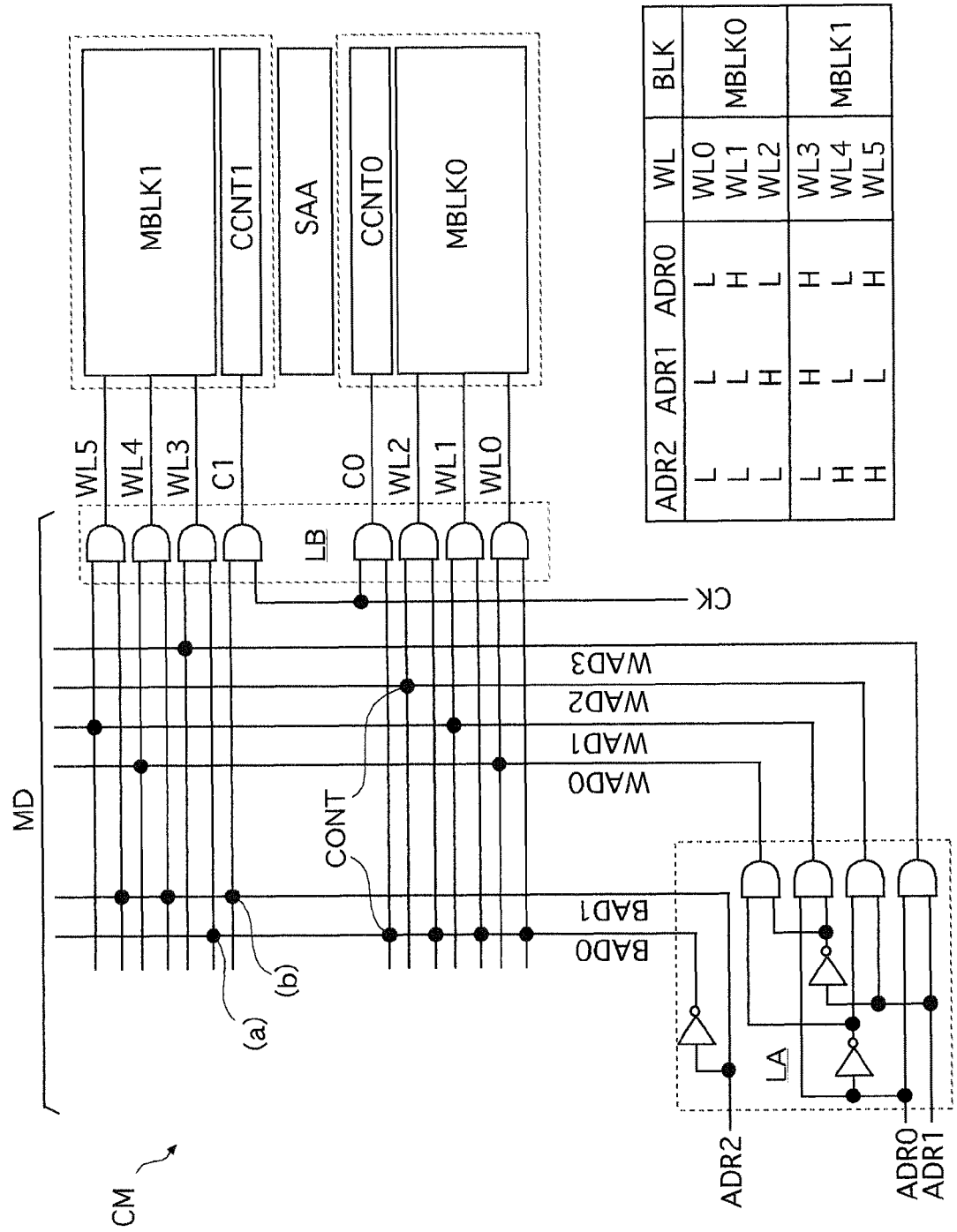
FIG. 5 is a circuit diagram illustrating a substantial part of another compiled memory.

FIG. 5 illustrates a substantial part of another compiled memory CM. It is necessary to equalize the lengths of the local bit lines LBL, /LBL of the memory blocks MBLK0-1 and to shorten the lengths of the local bit lines LBL, /LBL to shorten the access time of the compiled memory CM. Namely, it is necessary to equalize the numbers of word lines WL disposed at the memory blocks MBLK0-1. Accordingly, the word lines WL0-2 are disposed at the memory block MBLK0, and the word lines WL3-5 are disposed at the memory block MBLK1. However, in this case, the word line WL3 is selected when the address signal "ADR2=L" (FIG. 5(a)), but the couple control unit CCNT1 of the memory block MBLK1 including the word line WL3 is selected when the address signal "ADR2=H" (FIG. 5(b)). As a result, the compiled memory CM malfunctions.

Figure 6:
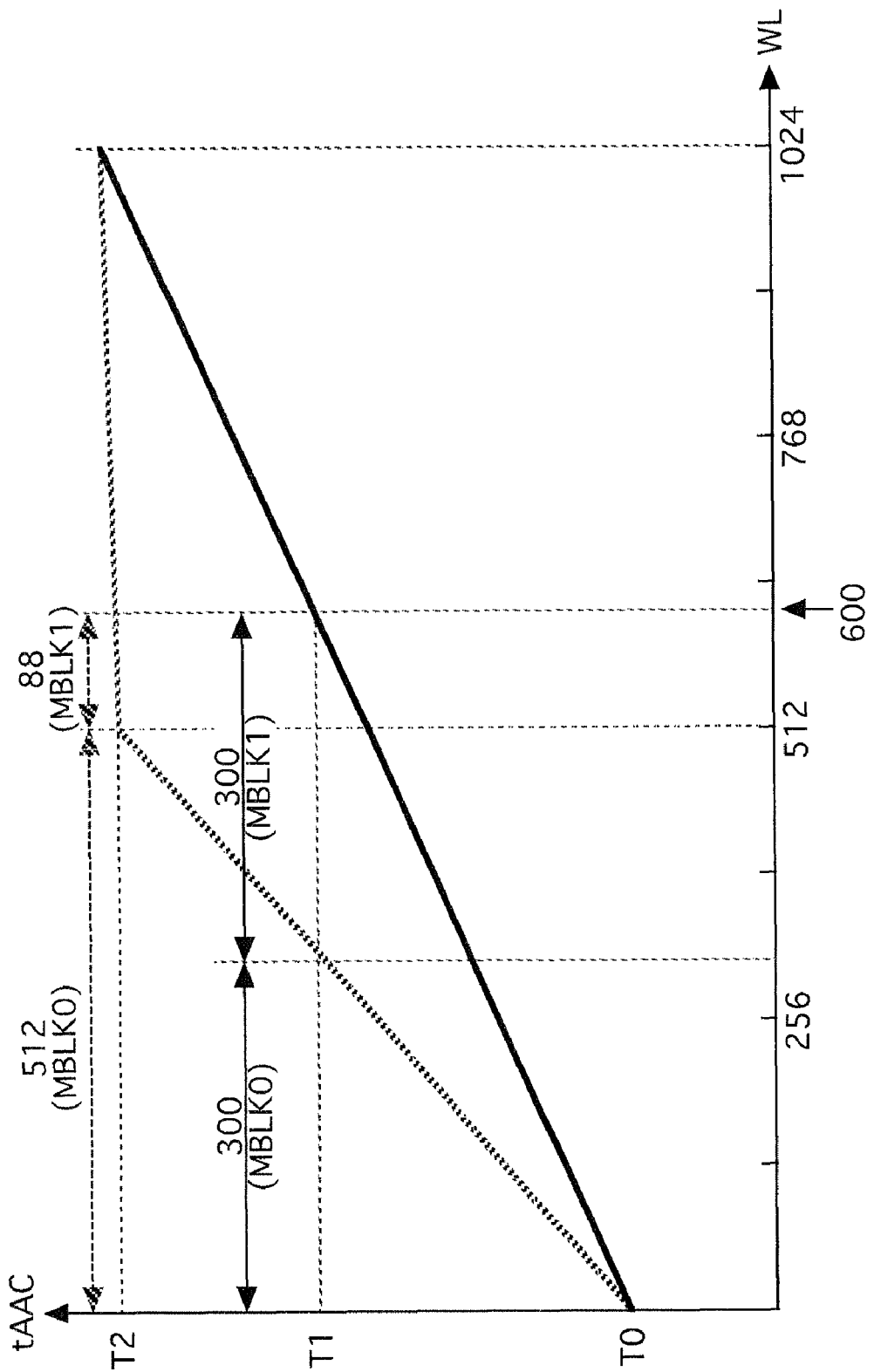
FIG. 6 is an explanatory view illustrating a relationship between the number of word lines laid out to the compiled memory and an access time.

FIG. 6 illustrates a relationship between the number of word lines WL (the word number) laid out at the compiled memory CM and an access time tAAC. A solid line in the drawing represents a state after the present embodiment is applied, and a dotted line in the drawing represents a state before the present embodiment is applied. In this example, the maximum word number which can be disposed at the memory block MBLK is "512". In the present embodiment, the word lines WL are disposed at the memory blocks MBLK0-1 alternately as illustrated in FIG. 2, and therefore, the lengths of the local bit lines LBL, /LBL increase every time when the word lines WL increase two pieces until the word number becomes "1024". Namely, the access time tAAC increases every time when the word lines WL increase two pieces until the word number becomes "1024". On the other hand, the word lines WL are disposed by each of the memory blocks MBLK as illustrated in FIG. 4. Accordingly, the lengths of the local bit lines LBL, /LBL increase every time when the word line WL increases one piece until the word number becomes "512". Namely, the access time tAAC increases every time when the word line WL increases one piece until the word number becomes "512".

For example, when the word number is set at "600", 300 pieces of word lines WL are disposed at each of the memory blocks MBLK0-1 in the present embodiment. The access time tAAC (specification) of the compiled memory CM at this time is "T1" corresponding to the lengths of the local bit lines LBL, /LBL passing over the 300 pieces of word lines WL. On the other hand, 512 pieces of word lines WL are disposed at the memory block MBLK0, and the remaining 88 pieces of word lines WL are disposed at the memory block MBLK1 as illustrated in FIG. 4. The access time tAAC (specification) of the compiled memory CM at this time is "T2" corresponding to the lengths of the local bit lines LBL, /LBL passing over the 512 pieces of word lines WL. Incidentally, "T0" of the access time tAAC is a time used for the decoder, the input/output circuit, and so on always requiring a constant operation time independent from the number of word lines WL.

Further, in this embodiment, the word lines WL are constantly disposed at the pair of memory blocks MBLK0-1 alternately. The access time tAAC increases every time when two pieces of word lines WL increase. Accordingly, in this embodiment, the access time tAAC is shortened also when the word number is "512" or less.

FIG. 7 illustrates the layout method for the compiled memory CM in the first embodiment. The flow illustrated in the drawing is realized by a layout design tool of the compiled memory CM executing a layout program. For example, the layout design tool is a computer such as a workstation, and the layout program (compiler) is executed by a controller such as an accommodated CPU. The layout data of the compiled memory CM is generated by executing the flow illustrated in the drawing. Incidentally, in FIG. 7, a description of a layout design flow of a circuit on a path on which the data signal is transmitted is not given.

At first, in step S10, the compiler receives an input of the number of bits BLN of the data signal and the number of words WLN representing the number of word lines WL, being the specification of the compiled memory CM. For example, when the compiled memory CM with 64 k bits is implemented on the ASIC chip and the bit number BLN is specified at 64 bits, the word number WLN is specified at 1024. When the bit number BLN is specified at 128 bits, the word number WLN is specified at 512. Incidentally, the bit number BLN may be specified by dividing into the number of data terminals and the number of memory cells MC (bit lines LBL) coupled to the word lines WL. In this case, the number of bit lines LBL is treated as the bit number BLN.

Next, in step S12, it is determined whether or not the input word number WLN exceeds the maximum word number WLNmax which can be disposed at one memory block MBLK. When the word number WLN exceeds the word number WLNmax, the process shifts to step S16. When the word number WLN is not more than the word number WLN-max, the process shifts to step S14.

In the step 514, the pair of memory blocks MBLK0-1 is generated, and the word lines WL which are a half of the word number WLN are disposed at each of the memory blocks MBLK0-1. On the other hand, in the step S16, the word number WLN is divided by even number values (2, 4, 6, . . . ) until the word number WLN1 which is smaller than the word number WLNmax appears. The obtained even number value is used as the number of memory blocks MBLK, and the obtained word numbers WLN1 are disposed at each of the memory blocks MBLK. Namely, the specified word number WLN is evenly divided so as to be smaller than the maximum word number WLNmax, and the layout data of the even numbers of memory blocks MBKL are generated.

Next, in step S18, the common sense amplifier area SAA is assigned between the pair of memory blocks MBLK, and the sense amplifier SA is disposed. In step S20, the couple control units CCNT are disposed between the memory blocks MBLK and the sense amplifier area SAA.

Next, in step S22, the number of bits of the address signal ADR which is necessary to identify the word lines WL is found, and a bit MBLKb to identify the memory blocks MBLK and a bit WLGb to identify the word lines WL (word groups WLG) are sequentially assigned from a low-order bit of the address signal ADR. A logic of the main decoder MD is therefore generated. The bits MBLKb, WLGb respectively correspond to the ADR0, ADR1 (or ADR2) illustrated in FIG. 2.

Next, in step S24, the contact units CONT are disposed at the intersection parts of the decoded signal lines in the reticulate state wired in the main decoder MD according to the generated logic of the main decoder MD. In step S26, an output of the main decoder MD is coupled to the word line WL and the column switch of the couple control unit CCNT. The layout data of the compiled memory CM is therefore completed.

As stated above, in the first embodiment, the bit ADR0 of the address signal ADR to identify the memory blocks MBLK is assigned lower than the bits ADR1-2 of the address signal ADR to identify the word lines WL (word groups WLG). Accordingly, it is possible to equalize the numbers of word lines WL disposed at the memory blocks MBLK with each other, and to shorten the lengths of the local bit lines LBL, /LBL. As a result, it is possible to minimize the wiring delay of the local bit lines LBL, /LBL, and to shorten the access time tAAC of the compiled memory CM.

Figure 8:
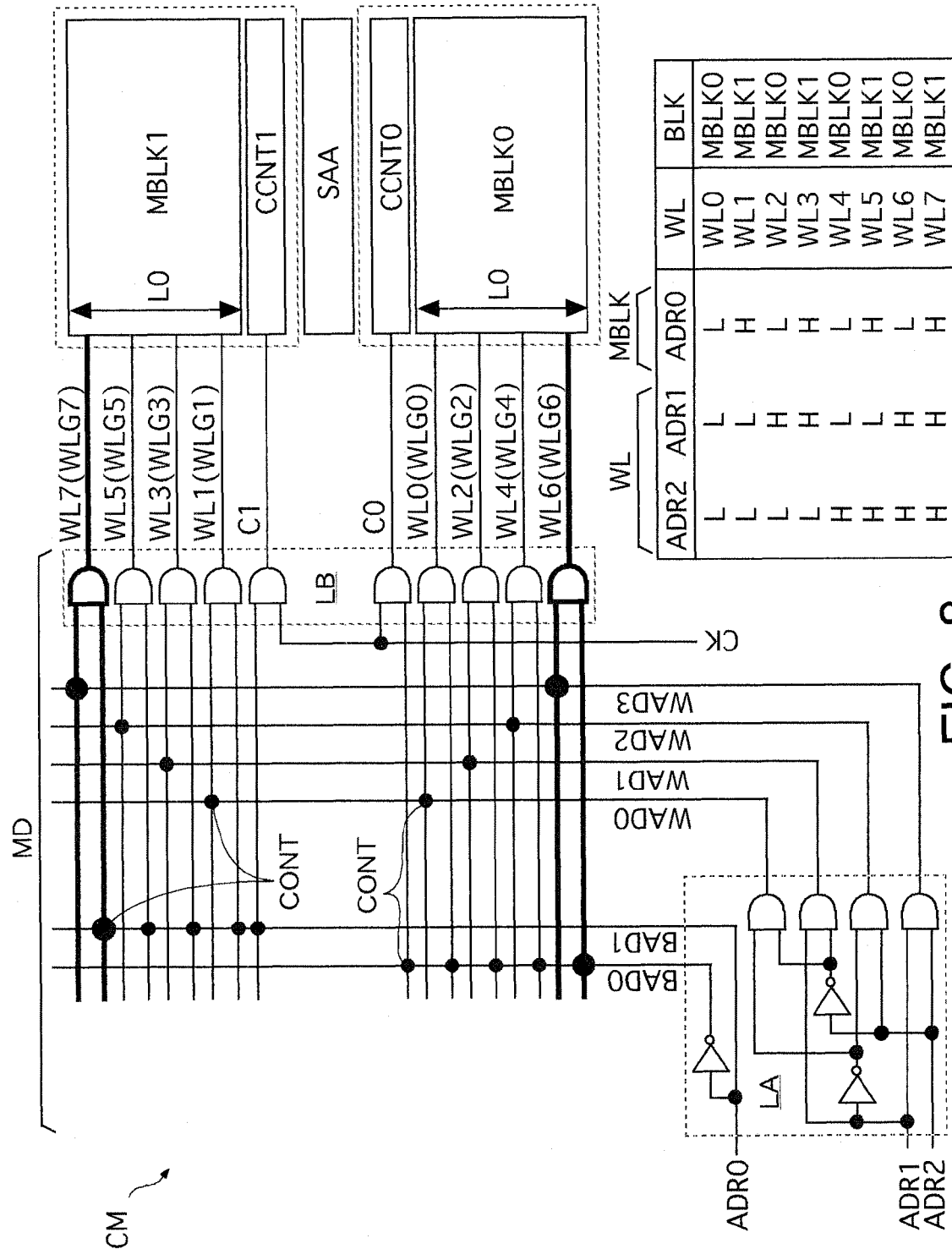
FIG. 8 is a circuit diagram illustrating a detail of a main decoder in a second embodiment of the present invention.

FIG. 8 illustrates a detail of a main decoder MD of a compiled memory CM in a second embodiment of the present invention. The same reference numerals and symbols are given to components the same as the components described in the first embodiment, and detailed explanation thereof will not be given. The compiled memory CM is, for example, an SRAM core, and formed on the ASIC chip with the other functional blocks as illustrated in FIG. 1. A system is independently formed as the ASIC chip, or the system is formed as the ASIC chip and the other semiconductor chips.

In this example, the word number is specified at "8" by a user specification, and eight pieces of word lines WL are disposed at the compiled memory CM. In each of the memory blocks MBLK0-1, four pieces of word lines WL are alternately disposed. Accordingly, it is possible to set lengths of the pair of local bit lines LBL, /LBL to be L0 in both memory blocks MBLK0-1, and to minimize the access time tAAC. Thick wirings and contact units CONT illustrated by large black circles, illustrated in the drawing represent components to be added to the above-described FIG. 2. As stated above, in the present embodiment, the layout data of the compiled memory CM can be generated easily by adding the wirings of the signal lines and the contact units CONT of the main decoder MD even in a case when the specified word number is different. The layout method for the compiled memory CM is the same as the flow illustrated in FIG. 7.

As stated above, it is possible to obtain the similar effects as the above-stated first embodiment also in the second embodiment. Further, the layout data of the compiled memory CM can be generated easily by adding or deleting the wirings and the contact units CONT even in the case when the word number is changed.

Figure 9:
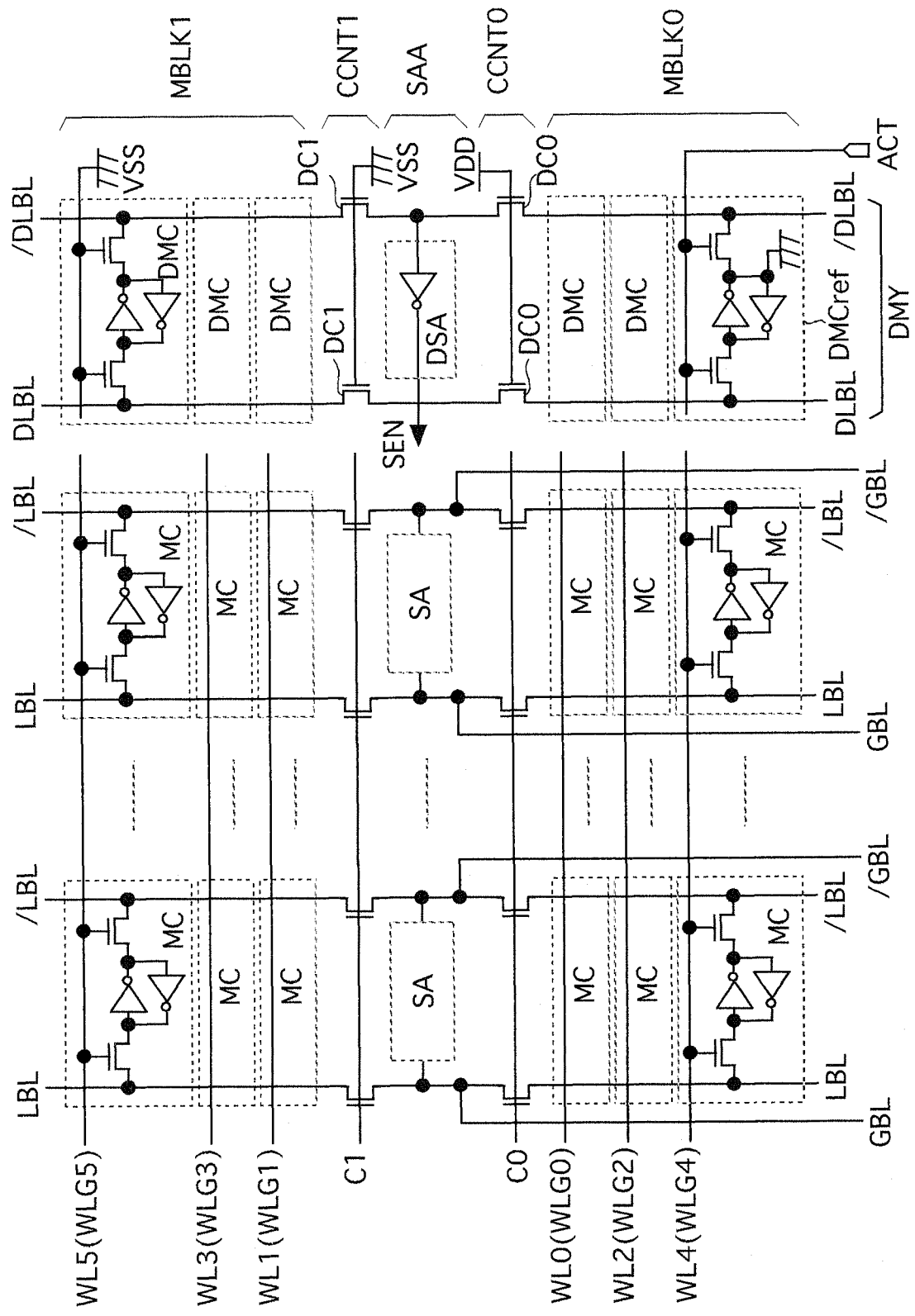
FIG. 9 is a circuit diagram illustrating a detail of a substantial part in a third embodiment of the present invention.

FIG. 9 illustrates a detail of a substantial part in a third embodiment of the present invention. The same reference numerals and symbols are given to components the same as the components described in the first embodiment, and detailed explanation thereof will not be given. The compiled memory CM is, for example, an SRAM core, and formed on the ASIC chip with the other functional blocks as illustrated in FIG. 1. A system is independently formed as the ASIC chip, or the system is formed as the ASIC chip and the other semiconductor chips. The layout method for the compiled memory CM is the same as the flow illustrated in FIG. 7.

In this example, the compiled memory CM includes a dummy area DMY to optimize an operation timing of the sense amplifier SA. The sense amplifier SA is a circuit processing a read data signal from the memory cell MC, and operates as a data processing unit. Dummy memory cells DMC, a pair of dummy local bit lines DLBL, /DLBL, a dummy sense amplifier DSA and dummy column switches DC0, DC1 are disposed at the dummy area DMY. A layout data and a disposal interval of the dummy memory cells DMC are the same as those of the real memory cells MC. Incidentally, in a dummy memory cell DMCref which is the farthest from the dummy sense amplifier DSA in the memory block MBLK0, a storage node of a latch coupled to the dummy local bit line /DLBL is coupled to a ground line. A gate of a transfer transistor of the dummy memory cell DMCref receives an activation signal ACT which is activated into high level in response to an access request to the memory cell MC of the compiled memory CM. Accordingly, a level of the dummy local bit line /DLBL (dummy data signal) changes into low level in synchronization with the activation of the activation signal ACT. Incidentally, the pair of dummy local bit lines DLBL, /DLBL is precharged into high level by a precharge circuit as same as the memory cell MC before the activation signal ACT is activated.

The column switch DC0 coupled to the dummy local bit lines DLBL, /DLBL of the memory block MBKL0 is constantly turned on by receiving a power supply voltage VDD at a gate thereof. The column switch DC1 coupled to the dummy local bit lines DLBL, /DLBL of the memory block MBLK1 is constantly turned off by receiving a ground voltage VSS at a gate thereof. The dummy sense amplifier DSA is includes, for example, a CMOS inverter of which input is coupled to the dummy local bit line /DLBL via the column switch DC0. The dummy sense amplifier DSA outputs a sense amplifier enable signal SEN to start an amplifying operation of the sense amplifier SA in synchronization with the activation of the activation signal ACT, namely, an output timing of the dummy data signal. The sense amplifier enable signal SEN is supplied to all of the sense amplifiers SA.

An operation timing of the sense amplifier SA is necessary to be set optimally independent from a position of the memory cell MC to be accessed (lengths of the local bit lines LBL, /LBL). In other words, the operation timing of the sense amplifier SA is necessary to be set in accordance with the memory cell MC of which access speed is the slowest. Accordingly, a period from the activation of the activation signal ACT to the output of the sense amplifier enable signal SEN is set by using the dummy memory cell DMCref which is the farthest from the dummy sense amplifier DSA. The dummy memory cell DMCref is also called as a self timing cell. This kind of timing setting method is called as a self timing method.

In the self timing method, the operation timing of the sense amplifier SA is set in accordance with the operation timing of the memory cell MC (DMCref) which is the farthest from the sense amplifier area SAA. In the compiled memory CM before the present embodiment using the self timing method, the access time tAAC is the same as the dotted line illustrated in FIG. 6. It is possible to make the access time tAAC the same as the solid line illustrated in FIG. 6 by applying the present embodiment to the compiled memory CM using the self timing method.

As stated above, it is possible to obtain the similar effects as the above-stated first embodiment also in the third embodiment. Further, the access time tAAC can be shortened also in the compiled memory CM using the self timing method.

Figure 10:
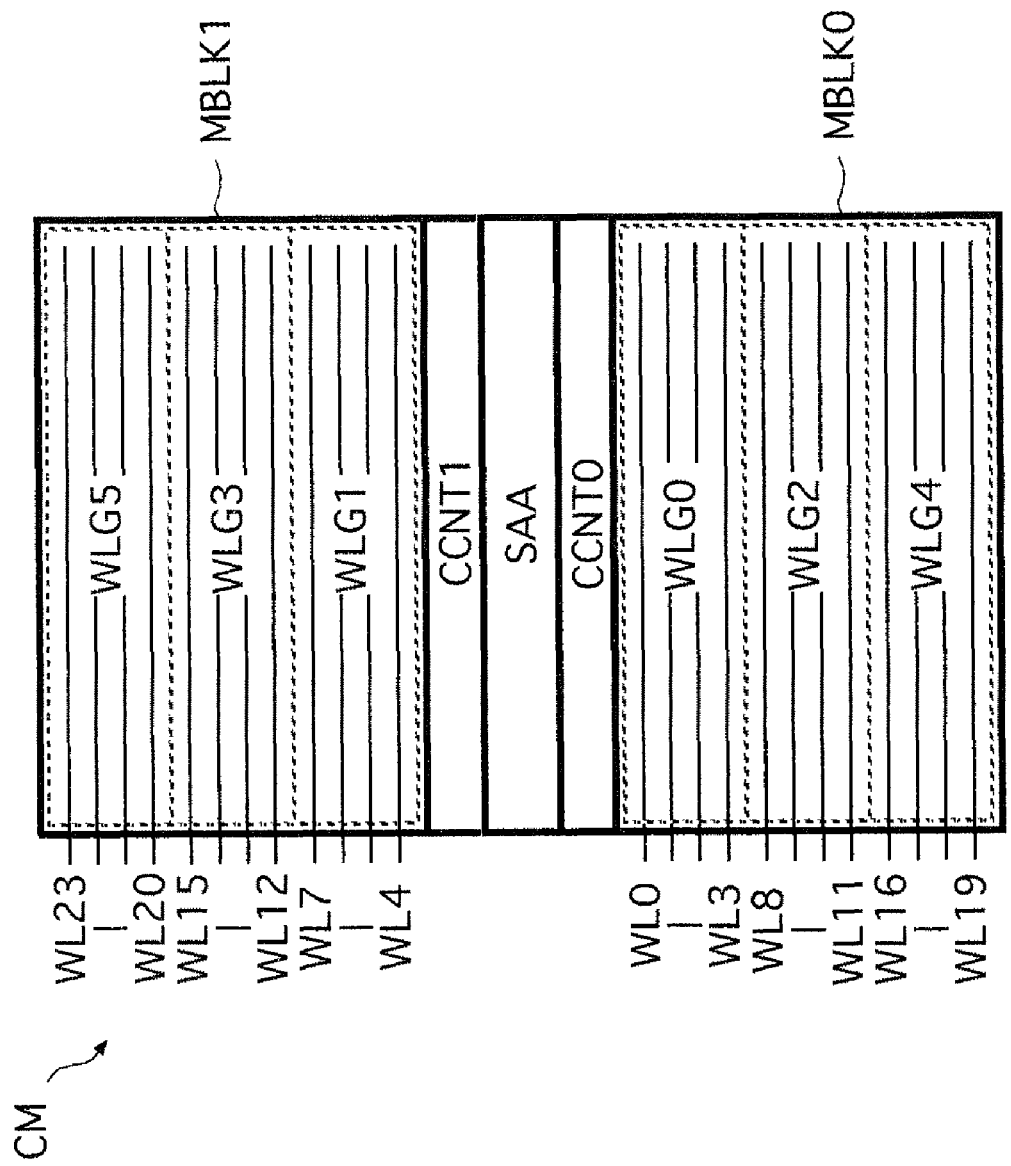
FIG. 10 is a circuit diagram illustrating a compiled memory in a fourth embodiment of the present invention.

FIG. 10 illustrates a compiled memory CM of a fourth embodiment of the present invention. The same reference numerals and symbols are given to components the same as the components described in the first embodiment, and detailed explanation thereof will not be given. The compiled memory CM is, for example, an SRAM core, and formed on the ASIC chip with the other functional blocks as illustrated in FIG. 1. A system is independently formed as the ASIC chip, or the system is formed as the ASIC chip and the other semiconductor chips.

In this embodiment, word groups WLG (WLG0-5) are formed every four pieces of word lines WL. In the memory blocks MBLK0-1, word lines WL (WL0-23) are disposed while using the word group WLG as a unit. The other constitutions are the same as the first embodiment except that the number of word lines WL is different.

FIG. 11 illustrates a logic of a main decoder MD in the fourth embodiment. The memory blocks MBLK0-1 and the couple control units CCNT0-1 are identified by a bit ADR2 of the address signal ADR. The word groups WLG in each of the memory blocks MBLK0-1 are identified by high-order bits ADR3-4 of the address signal ADR. The word lines WL in each of the word groups WLG are identified by low-order bits ADR0-1 of the address signal ADR.

As stated above, the logic of the main decoder MD is formed by assigning the bits of the address signal ADR to identify the memory blocks MBLK0-1 and the couple control units CCNT0-1 lower than the bits of the address signal ADR to identify the word groups WLG. Further, the logic of the main decoder MD is formed by assigning the bits of the address signal ADR to identify the word lines WL in each of the word groups WLG lower than the bits of the address signal ADR to identify the memory blocks MBLK0-1. As the address signals ADR0-4 advance sequentially, the memory blocks MBLK0-1 are alternately selected to be accessed while using the word group WLG as a unit.

Figure 12:
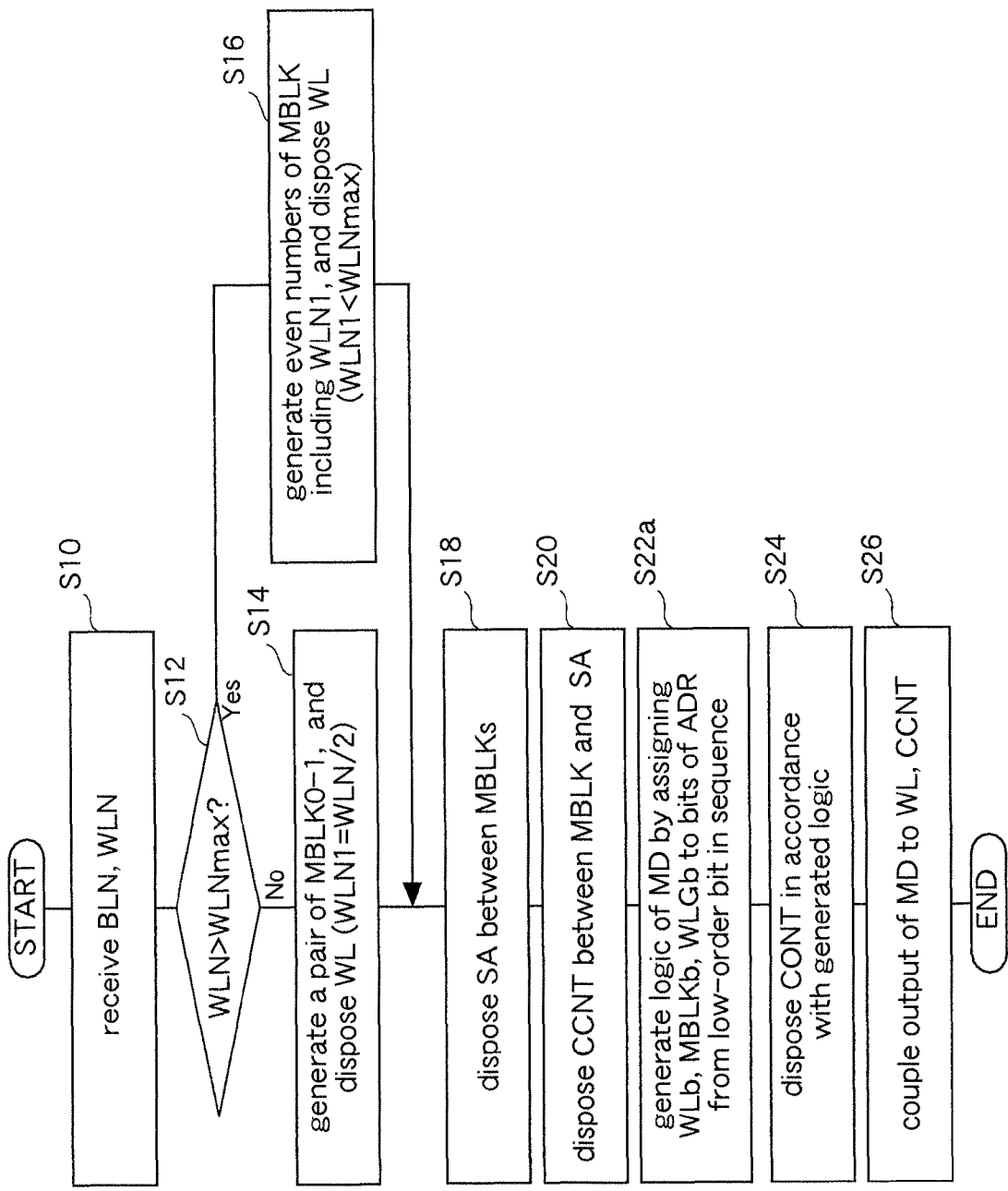
FIG. 12 is a flowchart illustrating a layout method for the compiled memory in the fourth embodiment.

FIG. 12 illustrates a layout method for the compiled memory CM in the fourth embodiment. In this embodiment, step S22*a* is executed instead of the step S22 in FIG. 7. The other flows are the same as FIG. 7.

In the step S22*a*, the number of bits of the address signal ADR required to identify the word lines WL is found, and a bit WLb to identify the word lines WL, a bit MBLKb to identify the memory blocks MBLK, and a bit WLGb to identify the word groups WLG are sequentially assigned from the low-order bit of the address signal ADR. The logic of the main decoder MD is therefore generated. The bits WLb, MBLKb, WLGb respectively correspond to the ADR0-1, ADR2, ADR4-5 illustrated in FIG. 11.

As stated above, it is possible to obtain the similar effects as the above-stated first embodiment also in the fourth embodiment. Further, the layout data of the compiled memory CM capable of shortening the access time tAAC can be generated easily even in a case when the word group WLG has the plural word lines WL.

Figure 13:
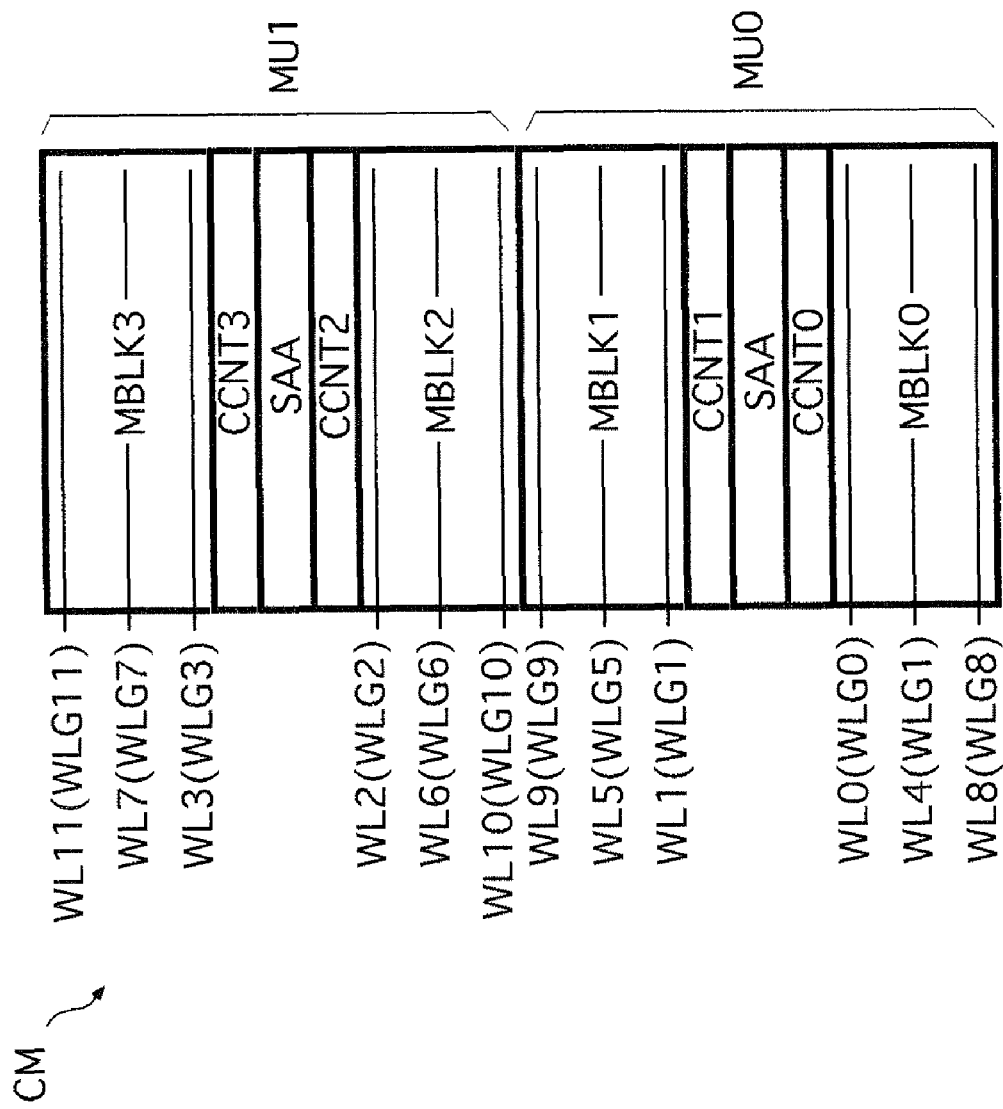
FIG. 13 is a circuit diagram illustrating a compiled memory in a fifth embodiment of the present invention.

FIG. 13 illustrates a compiled memory CM in a fifth embodiment of the present invention. The same reference numerals and symbols are given to components the same as the components described in the first embodiment, and detailed explanation thereof will not be given. The compiled memory CM is, for example, an SRAM core, and formed on the ASIC chip with the other functional blocks as illustrated in FIG. 1. A system is independently formed as the ASIC chip, or the system is formed as the ASIC chip and the other semiconductor chips. The layout method for the compiled memory CM is the same as the flow illustrated in FIG. 7.

In this embodiment, the compiled memory CM includes memory units MU0-1 having a pair of memory blocks MBLK (MBLK0-1 or MBLK2-3). Namely, the compiled memory CM includes four memory blocks MBLK0-3. Each of the memory units MU0-1 has the same constitution as the pair of memory blocks illustrated in FIG. 2. Each of the memory blocks MBLK0-3 includes three pieces of word lines WL (word groups WLG). For example, in the memory unit MU1, the memory block MBLK2 is coupled to the sense amplifier SA of the sense amplifier area SAA via the couple control unit CCNT2. The memory block MBLK3 is coupled to the sense amplifier SA of the sense amplifier area SAA via the couple control unit CCNT3.

Areas of the sense amplifier areas SAA and the couple control units CCNT increase by increasing the number of memory blocks MBLK. However, the lengths of the local bit lines LBL, /LBL are shortened, and the access time tAAC is shortened. Accordingly, it is effective to increase the number of memory blocks MBLK when the access time tAAC has priority over a layout size of the compiled memory CM. Besides, it is necessary to form the four pieces or more of memory blocks MBLK also when the word number specified according to the user specification exceeds double of the maximum word number which can be disposed at the memory blocks MBLK.

FIG. 14 illustrates a logic of a main decoder MD in the fifth embodiment. The memory blocks MBLK0-3 and the couple control units CCNT0-3 are identified by bits ADR0-1 of the address signal ADR. The word lines WL (word groups WLG) in each of the memory blocks MBLK0-1 are identified by high-order bits ADR2-3 of the address signal ADR.

As stated above, it is possible to obtain the similar effects as the above-stated first embodiment also in the fifth embodiment. Further, the layout data of the compiled memory CM capable of shortening the access time tAAC can be generated easily even in a case when the compiled memory CM includes plural memory units MU having the pair of memory blocks MBLK.

FIG. 15 illustrates a compiled memory CM in a sixth embodiment of the present invention. The same reference numerals and symbols are given to components the same as the components described in the first and fourth embodiments, and detailed explanation thereof will not be given. The compiled memory CM is, for example, an SRAM core, and formed on the ASIC chip with the other functional blocks as illustrated in FIG. 1. A system is independently formed as the ASIC chip, or the system is formed as the ASIC chip and the other semiconductor chips. The layout method for the compiled memory CM is the same as the flow illustrated in FIG. 12.

In this embodiment, the compiled memory CM includes memory units MU0-1 having a pair of memory blocks (MBLK0-1 or MBLK2-3). Namely, the compiled memory CM includes four pieces of memory blocks MBLK0-3. Each of the memory units MU0-1 has the same structure as the pair of memory blocks MBLK0-1 illustrated in FIG. 10 except that assigned address signals are different. Namely, word groups WLG (WLG0-11) are formed every four pieces of word lines WL. In the memory blocks MBLK0-3, word lines WL (WL0-47) are disposed while using the word group WLG as a unit. For example, in the memory unit MU1, the memory block MBLK2 is coupled to the sense amplifier SA of the sense amplifier area SAA via the couple control unit CCNT2. The memory block MBLK3 is coupled to the sense amplifier SA of the sense amplifier area SAA via the couple control unit CCNT3. In this embodiment, the word groups WLG0-3, WLG4-7, WLG8-11 are sequentially assigned to the memory blocks MBLK0-3 by the main decoder MD illustrated in FIG. 16. When the compiled memory CM includes the plural memory blocks MBLK, the word groups WLG are sequentially assigned to the memory blocks MBLK without being limited to FIG. 15.

FIG. 16 illustrates a logic of the main decoder MD in the sixth embodiment. The memory blocks MBLK0-3 and the couple control units CCNT0-3 are identified by bits ADR2-3 of the address signal ADR. The word groups WLG in each of the memory blocks MBL0-3 are identified by high-order bits ADR4-5 of the address signal ADR. The word lines WL in each of the word groups WLG are identified by low-order bits ADR0-1 of the address signal ADR.

As stated above, it is possible to obtain the similar effects as the above-stated first, fourth and fifth embodiments also in the sixth embodiment. Namely, the access time tAAC can be shortened even in a case when the compiled memory CM includes the plural memory units MU0-1, and the word group WLG has the plural word lines WL. Further, the layout data of the compiled memory CM capable of shortening the access time tAAC can be generated easily.

Incidentally, the example is described in which the above-stated embodiments are applied to the SRAM. However, the present embodiments can be applied to a compiled memory CM being a semiconductor memory such as a DRAM core or a ferroelectric memory core implemented on an ASIC chip, and of which word number is changed by a user specification. Further, a chip on which the compiled memory CM is implemented is not limited to the ASIC chip. For example, the compiled memory CM of the present embodiments may be implemented on an ASSP (Application Specific Standard Product) chip, a single chip micro-computer chip, and so on.

In the above-stated third embodiment, the example is described in which the operation timing of the sense amplifier SA is optimally set by using the self timing method. However, for example, an operation timing of the column switch or the I/O circuit may be set optimally by using the self timing method.

The present embodiments can solve the following problems. The local bit line is wired with correspond to memory cells and is wired by using a thin wiring layer close to a semiconductor substrate. Accordingly, wiring resistance thereof is high. Besides, the local bit line is coupled to a number of memory cells, and therefore, a parasitic capacitance thereof is large. Accordingly, an influence of a length of the local bit line exerted on an access time of a memory is large. On the other hand, the global bit line is wired by using a thick wiring layer away from the semiconductor substrate, and therefore, the wiring resistance is low. The global bit line is not coupled to the memory cells, and therefore, the parasitic capacitance is small. Accordingly, an influence of a length of the global bit line exerted on the access time of the memory is small compared to that of the local bit line. Consequently, it is important to shorten the length of the local bit line directly coupled to the memory cells to shorten the access time, in the memory having a hierarchical bit line structure.

A proposition of the present embodiments are to shorten an access time of a compiled memory by shortening a length of a bit line coupled to memory cells, in particular, to shorten an access time of a compiled memory formed on an LSI such as an ASIC chip.

A compiled memory includes a pair of memory blocks, a data control unit, couple control units and a decoder unit. Each of the memory blocks includes word groups each having at least one of word lines, memory cells coupled to the word lines, and bit lines coupled to each of the memory cells. The data control unit inputs/outputs a data signal to/from the memory cells via the bit lines. The couple control units are each provided with correspond to the memory blocks so as to selectively couple the bit lines of each of the memory blocks to the data control unit. The decoder unit selects one of the couple control units corresponding to one of the memory blocks to be accessed, and decodes an address signal to select any of the word groups. A logic of the decoder unit is formed by assigning a bit of the address signal to identify one of the memory blocks and one of the couple control units lower than a bit of the address signal to identify one of the word groups. For example, when each of the word groups includes a plurality of the word lines, the logic of the decoder unit is formed by assigning a bit of the address signal to identify one of the word lines in each of the word groups lower than a bit of the address signal to identify one of the memory blocks. Accordingly, it is possible to equalize the number of the word lines disposed at the memory blocks with each other and to shorten the length of the bit lines. As a result, it is possible to minimize wiring delay of each of the bit lines and to shorten the access time of the compiled memory.

A layout data of the compiled memory is generated by using a layout method as described below. At first, the bit number representing the number of bits of a data signal and the word number representing the number of the word lines coupled to the memory cells are received. When the word number to be received exceeds the maximum word number which can be disposed in each of the memory blocks, the specified word number is evenly divided to be smaller than the maximum word number, and a layout data of even numbers of the memory blocks are generated. Next, a bit of the address signal to identify one of the memory blocks are assigned lower than a bit of the address signal to identify one of the word groups, and thereby, the logic of the decoder unit to select the memory blocks and the word lines is generated. Contact units coupling the wires with each other are disposed at intersection parts of decoded signal lines wired in the decoder unit according to the generated logic, and thereby, the layout data is completed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be mage hereto without departing from the spirit and scope of the invention.

What is claimed is:

1. A compiled memory formed on a chip with a functional block and accessed by the functional block comprising:
   a pair of memory blocks each including word groups each having at least one of word lines, memory cells coupled to the word lines, and bit lines coupled to each of the memory cells;
   a data control unit inputting/outputting a data signal to/from the memory cells via the bit lines;
   couple control units each provided with correspond to the memory blocks to selectively couple the bit lines of each of the memory blocks to the data control unit; and
   a decoder unit selecting one of the couple control units corresponding to one of the memory blocks to be accessed, and decoding an address signal to select any of the word groups, wherein
   a logic of the decoder unit is formed by assigning a bit of the address signal to identify one of the memory blocks and one of the couple control units lower than a bit of the address signal to identify one of the word groups.

2. The compiled memory according to claim 1, wherein
   each of the word groups has a plurality of the word lines, and
   the logic of the decoder unit is formed by assigning a bit of the address signal to identify one of the word lines in each of the word groups lower than a bit of the address signal to identify one of the memory blocks.

3. The compiled memory according to claim 1, further comprising
   a plurality of memory units each including the pair of the memory blocks.

4. The compiled memory according to claim 1, wherein
   the data control unit includes a common sense amplifier coupled to the bit lines of the memory blocks via the couple control units.

5. The compiled memory according to claim 1, wherein
   one of the memory blocks includes a dummy memory cell outputting a dummy data signal representing a predetermined logical value with respond to an access request of the memory cells, and a dummy bit line coupled to the dummy memory cell, and wherein
   the data control unit includes a circuit starting an operation in synchronization with an output timing of the dummy data signal and processing a read data signal from each of the memory cells.

6. The compiled memory according to claim 5, wherein
   the data control unit includes a common sense amplifier coupled to the bit lines of the memory blocks via the couple control units, and wherein
   the sense amplifier starts an operation in synchronization with the output timing of the dummy data signal.

7. An ASIC chip comprising a functional block and a compiled memory accessed by the functional block, wherein and the compiled memory comprises:
   a pair of memory blocks each including word groups each having at least one of word lines, memory cells coupled to the word lines, and bit lines coupled to each of the memory cells;
   a data control unit inputting/outputting a data signal to/from the memory cells via the bit lines;
   couple control units each provided with correspond to the memory blocks to selectively couple the bit lines of each of the memory blocks to the data control unit; and
   a decoder unit selecting one of the couple control units corresponding to one of the memory blocks to be accessed, and decoding an address signal to select any of the word groups, wherein
   a logic of the decoder unit is formed by assigning a bit of the address signal to identify one of the memory blocks and one of the couple control units lower than a bit of the address signal to identify one of the word groups.

8. The ASIC chip according to claim 7, wherein
   each of the word groups has a plurality of the word lines, and
   the logic of the decoder unit is formed by assigning a bit of the address signal to identify one of the word lines in each of the word groups lower than a bit of the address signal to identify one of the memory blocks.

9. The ASIC chip according to claim 7, wherein
   the compiled memory further comprises a plurality of memory units each including the pair of the memory blocks.

10. The ASIC chip according to claim 7, wherein
    the data control unit comprises a common sense amplifier coupled to the bit lines of the memory blocks via the couple control units.

11. The ASCI chip according to claim 7, wherein
    one of the memory blocks includes a dummy memory cell outputting a dummy data signal representing a predetermined logical value with respond to an access request of the memory cells, and a dummy bit line coupled to the dummy memory cell, and wherein
    the data control unit includes a circuit starting an operation in synchronization with an output timing of the dummy data signal and processing a read data signal from each of the memory cells.

12. The ASIC chip according to claim 11, wherein
    the data control unit includes a common sense amplifier coupled to the bit lines of the memory blocks via the couple control units, and wherein
    the sense amplifier starts an operation in synchronization with the output timing of the dummy data signal.

13. A layout method for a compiled memory formed on a chip with a functional block and accessed by the functional block comprising:
    receiving the bit number representing the number of bits of a data signal and the word number representing the number of word lines coupled to memory cells;
    generating a layout data of even numbers of memory blocks while evenly dividing the specified word number to be smaller than a maximum word number when the word number to be received exceeds the maximum word number which can be disposed in each of the memory blocks;
    generating a logic of a decoder unit to select one of the memory blocks and one of the word lines by assigning a bit of an address signal to identify one of the memory blocks lower than a bit of the address signal to identify one of word groups each having at least one of word lines; and
    disposing contact units to couple wirings with each other at intersection parts of decoded signal lines wired in the decoder unit in accordance with the generated logic.

14. The layout method for the compiled memory according to claim 13, further comprising:
    disposing a sense amplifier between a pair of memory blocks adjacent with each other;

disposing couple control units each including a switch to couple bit lines wired in each of the memory blocks to the sense amplifier, between the sense amplifier and the memory blocks, respectively, and coupling an output of a decoder for selecting one of the memory blocks to a control terminal of the switch.

15. The layout method for the compiled memory according to claim 13, further comprising:

disposing word groups each having a plurality of the word lines;

generating the logic of the decoder unit to select one of the word lines by assigning a bit of the address signal to identify one of the word lines in each of the word groups lower than a bit of the address signal to identify one of the memory blocks; and disposing the contact units in accordance with the generated logic.

* * * * *